(12) United States Patent
Barron et al.

(10) Patent No.: US 9,913,361 B2
(45) Date of Patent: Mar. 6, 2018

(54) INTEGRATED CIRCUIT DEVICE ASSEMBLY

(71) Applicant: International Business Machines Corporation, Armonk, NY (US)

(72) Inventors: David Barron, Austin, TX (US); Jason R. Eagle, Kasson, MN (US); Roger D. Hamilton, Rochester, MN (US); Mark K. Hoffmeyer, Rochester, MN (US); Christopher W. Mann, Lakeway, TX (US); Matthew T. Richardson, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/989,271

(22) Filed: Jan. 6, 2016

(65) Prior Publication Data
US 2017/0196075 A1  Jul. 6, 2017

(51) Int. Cl.
*H05K 7/20* (2006.01)
*H05K 1/02* (2006.01)
(Continued)

(52) U.S. Cl.
CPC .......... *H05K 1/0204* (2013.01); *H01L 23/40* (2013.01); *H05K 1/181* (2013.01); *H05K 3/30* (2013.01);
(Continued)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467

USPC ...... 361/676–678, 679.46–679.54, 688–723; 165/80.1–80.5, 104.33, 185; 174/15.1–15.3, 16.1–16.3, 547, 548;
(Continued)

(56) References Cited

U.S. PATENT DOCUMENTS

| 4,593,342 A | 6/1986 | Lindsay |
| 6,104,614 A | 8/2000 | Chou et al. |

(Continued)

FOREIGN PATENT DOCUMENTS

| JP | 05029501 A | 2/1993 |
| JP | 3725257 B2 | 12/2005 |

*Primary Examiner* — Anthony Haughton
*Assistant Examiner* — Razmeen Gafur
(74) *Attorney, Agent, or Firm* — Patterson + Sheridan, LLP

(57) ABSTRACT

A method for assembling an integrated circuit device includes positioning a thermal interface material (TIM) on top of an electronic component, positioning a load frame onto a printed circuit board, the load frame having an open region for the electronic component to extend through, and positioning a heat sink onto the TIM. The method further comprises fastening a first screw fastener, resulting in a TIM bond line between the heat sink and the electronic component, and actuating a second screw fastener disposed within a bore of the heat sink and threaded into the load frame. The second screw fastener, upon being tightened expands radially to lock the heat sink into the load frame. The first screw fastener, upon the tightening of the second screw fastener, connects the heat sink and the load frame to the printed circuit board.

17 Claims, 4 Drawing Sheets

(51) Int. Cl.
    *H05K 1/18*     (2006.01)
    *H05K 3/30*     (2006.01)
    *H05K 5/00*     (2006.01)
    *H01L 23/40*     (2006.01)
    *H01L 23/473*     (2006.01)

(52) U.S. Cl.
    CPC ....... *H05K 5/0008* (2013.01); *H05K 7/20409* (2013.01); *H05K 1/0203* (2013.01); *H05K 2201/066* (2013.01); *H05K 2201/10409* (2013.01)

(58) Field of Classification Search
    USPC ... 257/712–722, E23.088; 24/453, 458–459; 454/184; 312/236
    See application file for complete search history.

(56) References Cited

U.S. PATENT DOCUMENTS

| | | | |
|---|---|---|---|
| 6,473,305 B1* | 10/2002 | Gordon | H01L 23/4093 165/185 |
| 6,483,708 B2 | 11/2002 | Ali et al. | |
| 7,215,550 B1 | 5/2007 | Yang et al. | |
| 7,280,360 B2 | 10/2007 | Malone et al. | |
| 7,345,881 B2 | 3/2008 | Colbert et al. | |
| 7,486,516 B2 | 2/2009 | Colbert et al. | |
| 7,777,329 B2 | 8/2010 | Colbert et al. | |
| 7,780,469 B2 | 8/2010 | Zschieschang et al. | |
| 7,983,048 B2 | 7/2011 | Sasaki et al. | |
| 8,363,404 B2 | 1/2013 | Colbert et al. | |
| 8,963,324 B2 | 2/2015 | Sato et al. | |
| 2004/0047129 A1* | 3/2004 | Simon | H01L 23/4006 361/697 |
| 2005/0122691 A1* | 6/2005 | Crippen | H05K 7/2049 361/719 |
| 2006/0126301 A1* | 6/2006 | Lee | H01L 23/3672 361/704 |
| 2006/0171123 A1* | 8/2006 | Hornung | H01L 23/433 361/704 |
| 2006/0285297 A1* | 12/2006 | Conner | H01L 23/4006 361/710 |
| 2007/0147000 A1* | 6/2007 | Kuo | H01L 23/4006 361/704 |
| 2007/0217159 A1* | 9/2007 | Long | H01L 23/4093 361/704 |
| 2008/0101033 A1* | 5/2008 | Cromwell | G06F 1/20 361/719 |
| 2008/0239673 A1* | 10/2008 | Wayman | H05K 7/20418 361/704 |
| 2008/0266807 A1* | 10/2008 | Lakin | H05K 7/20409 361/709 |
| 2008/0266808 A1* | 10/2008 | Aberg | H01L 23/4006 361/709 |
| 2009/0040731 A1* | 2/2009 | Jin | H01L 23/02 361/711 |
| 2010/0053904 A1* | 3/2010 | Chen | H01L 23/4093 361/720 |
| 2010/0142153 A1* | 6/2010 | Ho | H01L 23/3677 361/710 |
| 2011/0134606 A1* | 6/2011 | Gallarelli | H01L 23/32 361/679.54 |
| 2011/0157833 A1* | 6/2011 | Bohannon | H01L 23/4006 361/709 |
| 2011/0273845 A1* | 11/2011 | Jones | B25B 7/00 361/699 |
| 2012/0002371 A1* | 1/2012 | Tan | H05K 7/20445 361/709 |
| 2012/0087089 A1* | 4/2012 | Monson | H05K 7/1404 361/700 |
| 2012/0092826 A1* | 4/2012 | Heidepriem | G06F 1/20 361/679.54 |
| 2012/0162923 A1* | 6/2012 | Lee | H01L 23/32 361/719 |
| 2012/0218718 A1* | 8/2012 | Wertz | H01L 23/4338 361/718 |
| 2013/0016477 A1* | 1/2013 | Yokoya | H01L 23/36 361/719 |
| 2013/0044436 A1* | 2/2013 | Kovatchev | H05K 1/0218 361/720 |
| 2013/0119908 A1* | 5/2013 | Harada | H02P 6/10 318/400.42 |
| 2013/0182392 A1* | 7/2013 | Yu | H05K 7/2039 361/719 |
| 2014/0063731 A1* | 3/2014 | Fang | G06F 1/20 361/679.47 |
| 2014/0233174 A1* | 8/2014 | Demange | H05K 7/20218 361/679.47 |
| 2014/0268578 A1* | 9/2014 | Dolci | H05K 9/0049 361/719 |

\* cited by examiner

INTEGRATED CIRCUIT DEVICE ASSEMBLY

I. FIELD OF THE DISCLOSURE

The present disclosure relates generally to integrated circuit device assemblies.

II. BACKGROUND

Mezzanine cards allow for a variety of functional expansions for a host computer system. A mezzanine card may comprise a printed circuit board (PCB) having electronic components mounted on a bottom surface of the mezzanine card. Mezzanine cards are typically used in applications requiring relatively small enclosures, with physical dimensions defined by standards. In the assembly of the electronic components, a specified compressive force may be needed to hold everything in place. If more force than necessary is applied, there is an increased risk of mechanical damage to the electronic components.

III. SUMMARY OF THE DISCLOSURE

According to one embodiment, a method for assembling an integrated circuit device comprises positioning a thermal interface material (TIM) on top of an electronic component, positioning a load frame onto a printed circuit board, the load frame having an open region for the electronic component to extend through, and positioning a heat sink onto the TIM. The method further comprises fastening a first screw fastener, resulting in a TIM bond line between the heat sink and the electronic component, and actuating a second screw fastener disposed within a bore of the heat sink and threaded into the load frame to secure the heat sink to the load frame. In the method, the second screw fastener upon being tightened expands radially to lock the heat sink into the load frame, and the first screw fastener upon the tightening of the second screw fastener, connects the heat sink and the load frame to the printed circuit board.

According to another embodiment, an electronic device assembly comprises a printed circuit board having an electronic component positioned thereon, a load frame mounted on the electronic component, the load frame having an open region onto which the electronic component extends, a thermal interface material (TIM) disposed on the electronic component, and a heat sink in thermal contact with the electronic component through the TIM. The assembly further comprises a first fastener to fasten the heat sink to the load frame and the printed circuit board. A TIM bond line between the heat sink and the electronic component is set by fastening the first fastener. A second fastener is disposed within a bore of the heat sink and threaded into the load frame to fasten the heat sink to the load frame. The second fastener is a non-influencing threaded fastener with a head, a first ring disposed below the head, and a second ring disposed below the first ring. When the second fastener is actuated, the second ring expands radially to lock the heat sink into the load frame.

According to yet another embodiment, an assembly comprises a field-replaceable unit (FRU) comprising an electronic component and a printed circuit board having the FRU positioned thereon. The assembly further comprises a load frame mounted onto the printed circuit board, the load frame having an open region onto which the FRU extends, exposing a surface of the FRU. The assembly further comprises a thermal interface material (TIM) disposed on the FRU, a heat sink in thermal contact with the FRU through the TIM, and a first fastener to fasten the heat sink to the load frame and the printed circuit board. The assembly also comprises a second fastener disposed within a bore of the heat sink and threaded into the load frame to fasten the heat sink to the load frame. The second fastener includes a threaded fastener with a head, a first ring disposed on the threaded fastener below the head of the threaded fastener, and a second ring disposed below the first ring. The second ring expands radially to lock the heat sink into the load frame, and the first fastener is removable to replace the FRU.

Features and other benefits that characterize embodiments are set forth in the claims annexed hereto and forming a further part hereof. However, for a better understanding of the embodiments, and of the advantages and objectives attained through their use, reference should be made to the Drawings and to the accompanying descriptive matter.

IV. DETAILED DESCRIPTION

Figure 1:
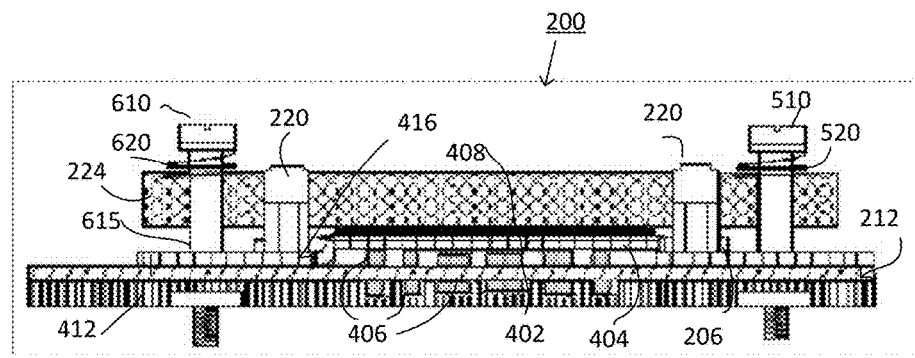
FIG. 1 is a cross-sectional view of an embodiment of a system employing multi-purpose fasteners and non-influencing fasteners (NIFs) to assemble electronic components.

The following detailed description sets forth an embodiment or embodiments in accordance with the present disclosure. In the following description, numerous specific details are set forth such as material types, dimensions, and ranges, in order to provide a thorough understanding of the subject matter of the present disclosure. In other instances, well-known elements and processing techniques have not been shown in particular detail.

If used and unless otherwise stated, the terms "upper," "lower," "front," "back," "over," "under," and similar such terms as used herein are not to be construed as limiting the invention to a particular orientation. Instead, these terms are used only on a relative basis.

Field-replaceable unit or (FRU) refers to a circuit board, part, or assembly that can be quickly and easily removed from a computer, an instrument, or other piece of electronic equipment, and replaced by the user or a technician without having to send the entire product or system to a repair facility.

Non-influencing fastener or NIF refers to a fastener for locking a first component in position with a second component without "influencing" or distorting the position of the first component. When tightened by being threaded into a boss or a bore, the NIF expands radially to lock the first component into the second component, with little or no translational forces being applied, e.g., the screw can be actuated with little if any downward components of motion and force.

Shoulder screws, also known as shoulder bolts and stripper bolts, refer to machine screws with an integral shoulder or journal between the head and the thread. The head has the largest diameter, the shoulder is described by its diameter and length, and the thread has a major diameter smaller than the shoulder diameter.

Stiffener refers to a relatively thin but rigid structure to support the printed circuit board (PCB) to resist bending and flexing stresses. As flat sheets, PCBs are subject to bending and flexing stresses depending on the weight of the attached components and the method used to attach the PCB to the chassis. In one embodiment, the stiffener is made from a material that is thermally conductive. In this embodiment, the stiffener may be used as part of a heat dissipation system. In another embodiment, the stiffener is made from a material that is electrically conductive. In this embodiment, the stiffener may be used as part of a power or grounding system. In another embodiment, the stiffener is made from an electrically insulative material to minimize electrical shorting.

Heat sink may be used interchangeably with heat spreader, thermal plate, or heat dissipating device, referring to a device to control or dissipate heat in electronic assemblies. Electronic components, e.g., microprocessors and integrated circuits, etc., must operate within certain specified temperature ranges to perform efficiently. Some heat sinks are formed with fins, pins, or other similar structures to increase the surface area of the heat sink and thereby enhance heat dissipation as air passes over the heat sink. Heat sinks may be made of any suitable thermally conductive material, such as a metal or thermally conductive composite material. Examples include copper, a copper alloy, aluminum, or an aluminum alloy.

Thermal interface material or thermal interposer material (TIM) refers to a material or layer that may be provided between a heat sink and one or more electric components. Thermal interface material may be a thermally conductive material such as thermal gel, grease, paste, oil, or other high thermal conductivity material. TIM layer can be relatively thin so that the TIM may easily transfer heat away from the semiconductor chip toward the heat sink.

Bare die refers to a package-free or unpackaged, or free-standing (without a cap) electronic component, e.g., a semiconductor device such as a microprocessor chip. Bare die may be used interchangeably with bare module, or bare die module. In one embodiment, a bare die module includes a module substrate, an electronic component such as a semiconductor chip, and electronic connectors.

In one embodiment, the disclosure relates to an assembly of a mezzanine-type card. An example is a card that snaps into a server system board and allows for multiple connections to be made between graphic processing units (GPUs). A typical assembly may include a heat sink, a thermal interface, a semiconductor chip, a base package or module, and electrical connection components, clamped together to ensure proper electrical connections and heat transfer capabilities. Significant clamping force (e.g., exceeding the ability of a human) may be required to clamp the arrangement tightly enough to ensure a proper electrical connection through the thermal interface. The heat sink-to-chip connection may not require a similar clamping force to provide heat transfer capability. However, if the components in the entire assembly are clamped together, all components are subjected to the same clamping force. The clamping force may damage the chip.

In the assembly of a mezzanine-style card, the assembly may require a load to overcome the insertion force of the connectors, a method of mass isolation to prevent damage to the connectors due to shock and vibration, another load to set the TIM bond line thickness between the heat sink and the semiconductor chip present on a module, and another method of mass isolation to prevent damage to the chip set due to shock and vibration. The card with all these features may fit into limited component keep-out areas according to standards. In one embodiment, a system and method for combining shoulder screws and NIFs is disclosed to multiplex diverse loading schemes for assemblies comprising connectors and heat sinks, with particular benefits derived from heat sinks disposed on bare die electronic chips. In one embodiment, a single set of fasteners is used in combination with a proportional number of NIFs to allow for mass isolation with respect to the other elements in the loading stack.

In one embodiment, either NIFs or preload may be used for mass isolation. NIFs may be used to attach relatively heavy heat sinks to bare die chips so that the mass of the heat sink in a shock environment does not imply stress on the die and risk damage, e.g., cracking. Additionally, with mezzanine-style cards, loading or mass isolation may also be employed to prevent damage to the connectors in shock environments.

In some embodiments to address the complexity of the connector insertion (and optionally, extraction in some embodiments) and before the NIFs are used to secure the heat sink position and set the bond line between the heat sink and bare die chip, a minimum number of multi-purpose fasteners are used to both apply a multiplicity of loads to the connectors and heat sink. The assembly method follows a certain order of operations, wherein a set of fasteners applies a multiplicity of loads, after which a set of NIFs lock the position and loads in place to facilitate mass isolation. By using fasteners that perform multiple functions e.g., a single set of shoulder screws, the assembly is not burdened with extra fasteners and complexity.

In one embodiment, the fasteners are shoulder screws. In another embodiment, the shoulder screws are used in conjunction with compression springs, e.g., conical springs or load springs, to imply the required loads. These springs are compressed via the mechanical advantage of the shoulder screws. Upon removal, the shoulder screws provide an extraction force along the negative axis of connector insertion. In this way, the multiplicity loading of the shoulder screws enables load isolation with NIFs, but also preload of the extraction springs to aid in removal.

In one example of an assembly, compression springs are retained between the head of the shoulder screw and the heat spreader to imply a specific load to the TIM, setting the bond line of the TIM between the chip(s) and heat sink surface(s). In one embodiment with the shoulder of the screws "sitting" on the bare substrate, actuating or fastening the screws implies a load to the connectors to overcome the insertion force and a load to the compression springs to load the thermal interface material.

In an embodiment of an assembly method, once the shoulder screws are fully fastened, the NIFs are tightened. The NIFs upon being tightened, expand radially to lock the heat sink into the load frame without applying translational forces. The tightening of the NIFs allows for the shoulder screws to be used again in another fastening step to integrate and interconnect the heat sink/chip assembly to a base circuit board. As such, two separate insertion forces (e.g., load limited on the compression springs, and a large load on the connectors) are applied during the card to base circuit board interconnect integration, while the mass of the two separate elements of the card and heat sink sub-assembly system can be isolated. The TIM bond line can be set with a small number of assembly operations with a common set of fasteners. The combination of operations within the shoulder screws as combined with load isolation via the NIFs, reduces the overall numbers of steps and required parts. By multiplexing the function of the fasteners in combination with the NIFs, different loads can be applied and then isolated with respect to their respective counterforces. Furthermore, more loads may be multiplexed through the fasteners and isolated with NIFs given that more shoulders are added to the fastener.

It may be necessary to replace parts in the field with the use of bare die chips in electronic enclosures. After the NIFs have been used in systems assembled using methods in the prior art, they typically cannot be reused. With the prior art assembly system, current service actions may require the replacement and marking of these fasteners in order to ensure they are not accidentally recycled back into the system. In embodiments of the systems assembled by the methods disclosed herein, the assembly of the daughter card (e.g., a printed circuit card or PCB, a GPU, etc.) with heat sink fastened using NIF's is a transportable FRU. When a service action is required, the outer fasteners (e.g., a set of four shoulder screws) are removed. The removal of the outer fasteners does not decouple the heat sink from the card. It allows the removal of the daughter card from the overall assembly, and then a new FRU can then be dropped into the system and fastened with the shoulder screws. In this fashion, the definition and specific manufacture of the FRU is defined to allow for the NIFs to be a manufacturing level action only. The customer or service representative is not required to replace the one-time use NIFs.

FIG. 1 is a cross-sectional view of an assembly 200 according to one embodiment. Multi-purpose fasteners 610, e.g., shoulder screws, apply a preload force to heat sink 224 toward an electronic component, e.g., semiconductor chip 402 to compress a thermally conductive material (TIM) 408 and achieve a desired thermal interface gap between heat sink 224 and a bare die module. TIM 408 is dispensed on semiconductor chip 402 prior to bringing the assembly of load frame 206/backside stiffener 412 and the heat sink 224 together. Load frame 206 has an open region onto which the semiconductor chip 402 extends through. The thickness of the TIM extending between heat sink and semiconductor chip may be referred to as the thermal interface gap. In a particular exemplary embodiment, the thermal interface gap may be about 1.2 mils.

The bare die module comprises electronic components such as a semiconductor chip 402, a module substrate 404, and electronic connectors 406. Semiconductor chip 402 is electronically connected to module substrate 404. Electronic connector 406 electrically connects printed circuit board 212 to module substrate 404. Although not shown, additional modules residing on printed circuit board 212 may be accommodated on load frame 206. Those skilled in the art will appreciate that the assembly 200 may accommodate electronic components including but not limited to a single-chip module (SCM), multi-chip modules (MCMs), a combination of MCMs, SCMs and/or other electronic components/heat sources.

The shoulder 615 of shoulder screws 610 is inserted through a bore (not shown) in the heat sink 224 and sits on the load frame 206. Compression springs 620 (e.g., heat sink load springs) are retained between the head of shoulder screws 410 and the heat sink 224, implying a specific load to the TIM 408 and the specified load to set the bond line of the TIM between the chip 402 and the heat sink surface. Fastening of shoulder screws implies a load to the electronic connectors 406 to overcome the insertion force as well as to the compression springs 620 to load the TIM.

The compression springs 620 are disposed to act between the shoulder 615 of the fastener 610 and the top surface of the bare module, which is optionally coupled with NIFs 220 for isolating the mass of the overall card assembly with respect to the main planar. The springs 620 in one embodiment as shown are conical springs, due to their near linear load deflection curve, which allows for another application of controlled loading via the fastener to enable load isolation with the NIFs.

After the shoulder screws 610 apply a multiplicity of loads to the connectors 406 and heat sink 224, non-influencing fastener (NIF) 220 including a screw 510 is threaded into one of the bosses 416 of load frame 206. Once the shoulder screws 610 are fastened, the NIFs 220 are tightened, allowing for the shoulder screws 610 to be used again in another fastening step to integrate and interconnect the bare module to the base circuit board 212. It should be noted that more than one heat sink can be used, and a heat sink can be disposed below the bare die electronic chips although the particular benefits may be derived from a heat sink disposed on the bare die chip.

Figure 2:
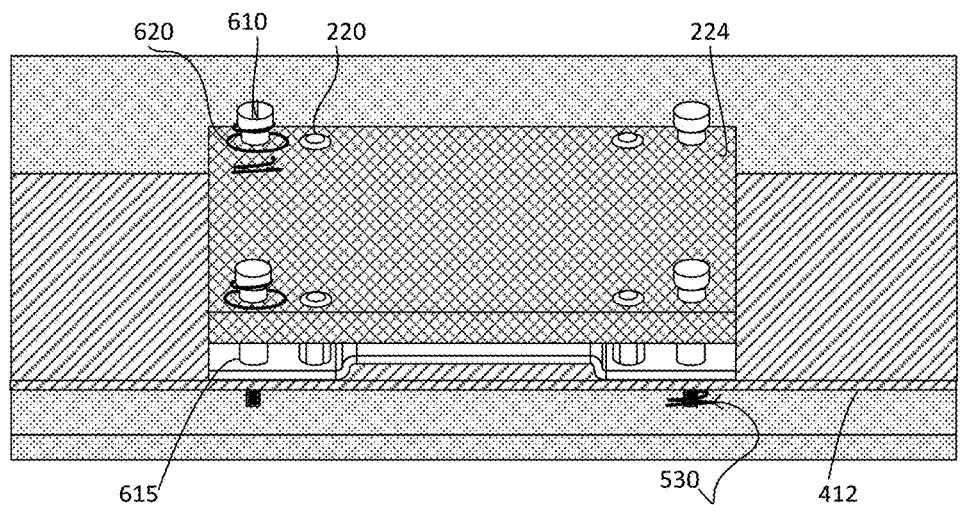
FIG. 2 is a perspective view of the system of FIG. 1.

FIG. 2 is a perspective view of the system of FIG. 1 with the addition of springs, e.g., wave springs (or extraction springs), to balance more loads in an assembly. The wave springs 530 are located below the stiffener 412 of a printed circuit card (not shown). The multiplicity of loads exerted by the shoulder fasteners 610 is extended to these compressive springs 530 disposed to act between the main planar of the system and the printed circuit card. After using the shoulder screws to apply a multiplicity of loads to the connectors and the heat sink, non-influencing fasteners 220 are used to secure the position of the heat sink 224.

The compressive springs may be compressed via the mechanical advantage of the shoulder screws. Upon removal, the shoulder screws provide an extraction force along the negative axis of the connector insertion. In this way, the multiplicity loading of the shoulder screws enables load isolation with NIFs, but also preloading of the extraction springs to aid in removal.

Figure 3A:
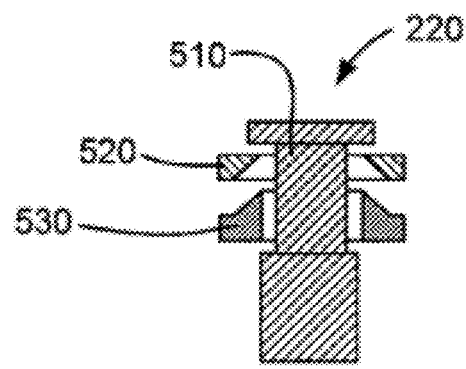
FIG. 3A is a cross-sectional view of an embodiment of a NIF in a non-actuated state.
Figure 3B:
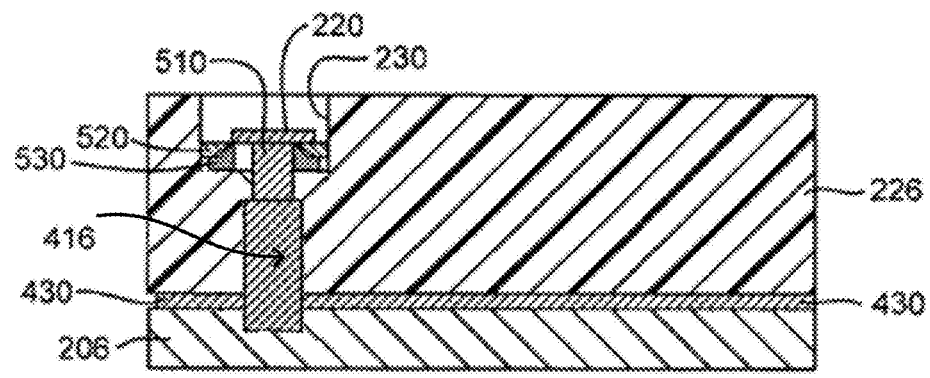
FIG. 3B is a cross-sectional view showing the NIF of FIG. 3A in an actuated state.

Embodiments of the NIF arrangements are shown in more detail in FIGS. 3A, 3B, 4A, and 4B. For instance, FIG. 3A shows an embodiment of a non-influencing fastener arrangement with non-influencing fastener 220 in a non-actuated state. FIG. 3B shows the non-influencing fastener 220 of FIG. 3A in an actuated state.

Non-influencing fastener 220 includes a screw 510 that is threaded into one of the bosses 416 of load frame 206. Screw 510 comprises a tapered ring 520 located below the head of the screw 610, and a sealing ring 530 under the tapered portion of tapered ring 520. Preferably, non-influencing fastener 220 also includes a load washer (not shown) interposed between the sealing ring 530 and the load frame's boss 416. The non-influencing fastener 220 is smaller in diameter than the bore hole 230 in the heat sink's base plate 226. It is inserted into the bore hole 230 and actuated by turning screw 510 into the load frame's boss 416 so that sealing ring 530 is expanded against the wall of bore hole 230 in the heat sink's base plate 226 to hold the heat sink in place. The non-influencing fastener 220 can be actuated without having a downward component of motion and force that would affect the thermal interface gap established by the preload force of the heat transfer apparatus' actuation mechanism.

Figure 4A:
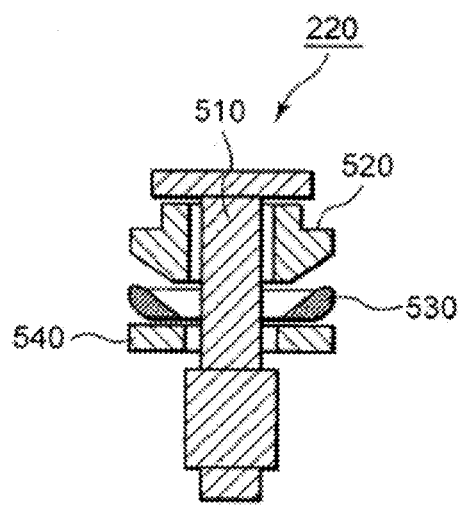
FIG. 4A is a cross-sectional view of a second embodiment of a NIF in a non-actuated state.
Figure 4B:
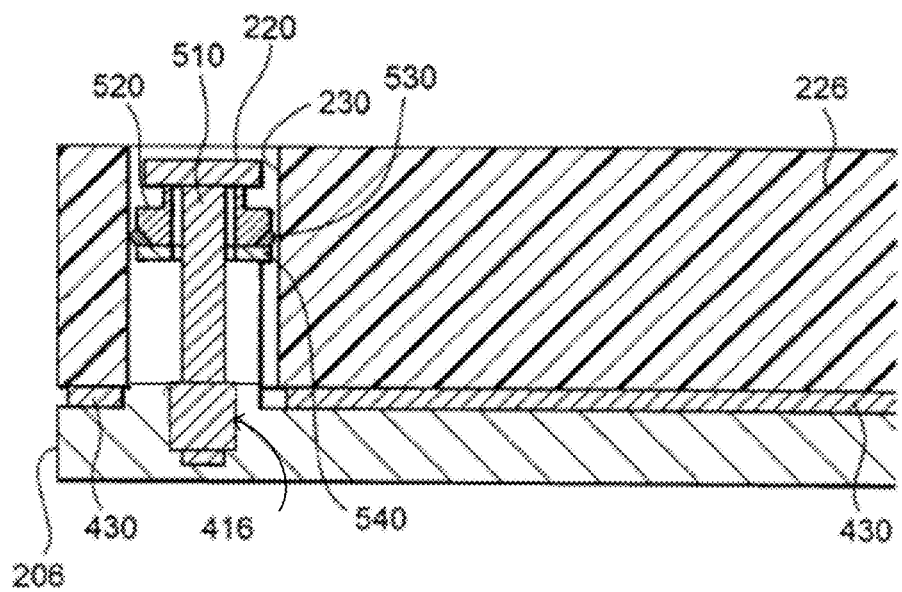
FIG. 4B is a cross-sectional view showing the NIF of FIG. 4A in an actuated state.

FIG. 4A shows a second embodiment of a non-influencing fastener arrangement with the non-influencing fastener having a load washer in a non-actuated state. FIG. 4B shows the non-influencing fastener 220 with a load washer of FIG. 4A in an actuated state.

Differences between this second embodiment and the first embodiment of the NIF arrangements in FIGS. 3A and 3B include the addition of a load washer 540 interposed between the sealing ring 530 and the load frame's boss 416. Additionally, the sealing ring 530 as illustrated in FIGS. 4A and 4B has a curved outer surface to allow for good contact between the non-influencing fastener 220 and the heat sink bore 230, even when there is some axial tilt tolerance between the non-influencing fastener 220 and the heat sink bore 230. In another embodiment, the sealing ring 530 is a split metal ring with a tapered inner surface. Alternatively, the sealing ring 530 could be a split ring with a circular cross-section and could be formed from a hard metal wire. The split metal ring easily expands radially when actuated by the tapered ring 520, to provide a stable connection between the heat sink 224 and the load frame 206. In an alternative embodiment, the sealing ring 530 may be made of a low yield strength metal or an elastomer.

Figure 5:
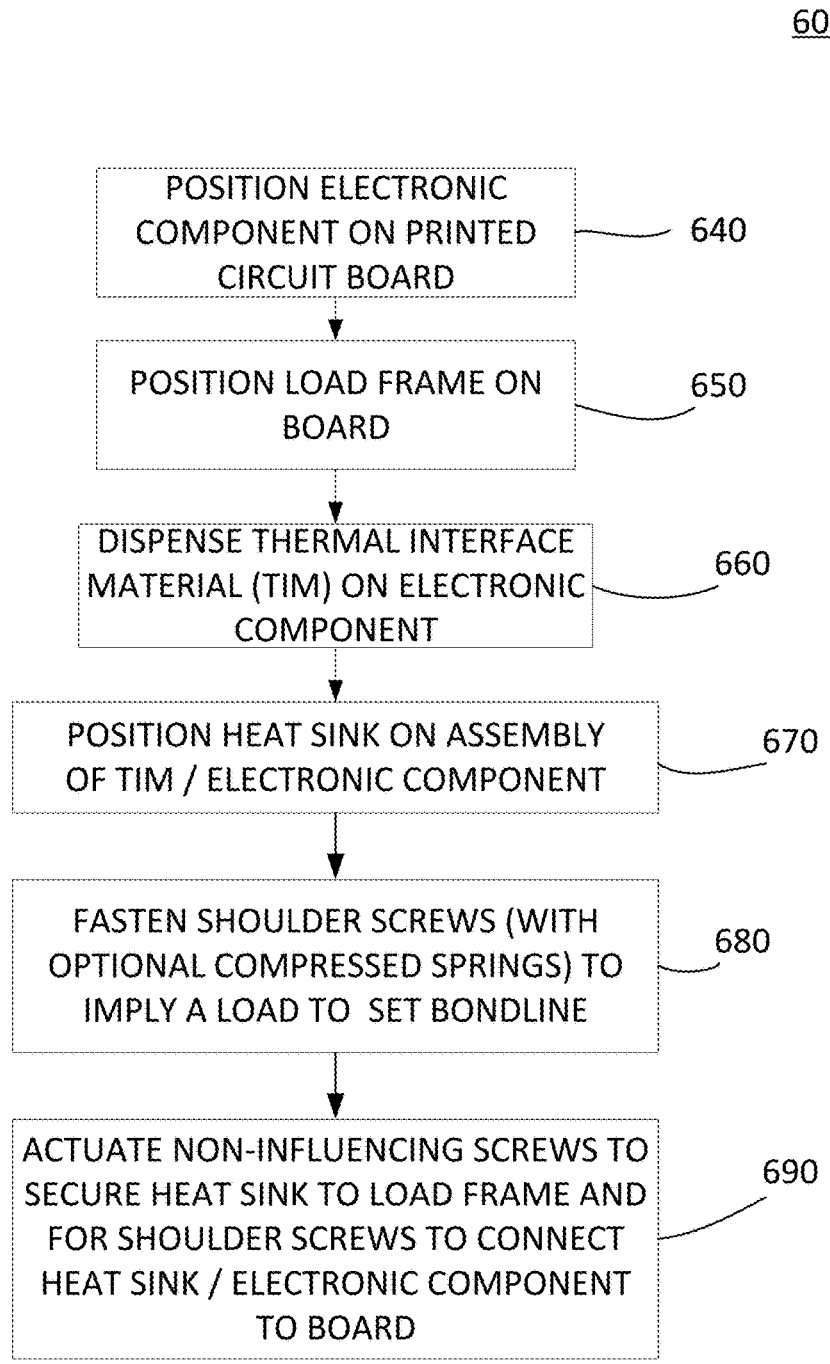
FIG. 5 illustrates a flow diagram of an exemplary method for assembling electronic components.

FIG. 5 illustrates a flow diagram of an exemplary method 600 for assembling electronic components in one embodiment. It should be understood that some of the steps may not have to be carried out in the order as shown. In addition, each of the following steps of the exemplary method 600 may be carried out, initiated, or controlled by one or more hardware devices or machines (e.g., industrial press and automated machine assembly components). For example, a processor may initiate and/or control activation of one or more assembly machines to perform assembly operations as described herein. An electronic component (e.g., a bare die module) is positioned on a printed circuit board (640). A load frame is positioned on the printed circuit board (650). A thermally conductive material (TIM) is dispensed on the bare die module (e.g., the semiconductor chip), at 660. A heat sink is next positioned on the TIM/chip assembly, at 670. The method continues, at 680, to actuate a set of multi-purpose fasteners (shoulder screws) with optional conical springs retained between the head of the shoulder screw and the heat sink to imply a load to the TIM and the load creates or sets the bond line of the TIM residing between the chip and heat sink surfaces.

In one embodiment, the shoulder screw is turned an appropriate amount to apply a preload force (e.g., 40 lbs.) that provides the desired thermal interface gap (e.g., 1.2 mils). In other words, some of the thermally conductive material is squeezed-out by the preload force to provide a desired thermal gap according to specifications. Thermal sensors may be used to measure the thermal interface gap achieved (not shown in FIG. 5).

In operation, the shoulder screws are fastened with sufficient force to a point at which the connector is fully seated but before the wire in the compression spring collapses to a seated condition (e.g., defined by another shoulder in the fastener). In this way, a near linear load accounts for tolerance accumulation within the system without affecting the overall loading of the connectors.

Next, the non-influencing fasteners (NIFs) are actuated (tightened), at 690, to set the preload on the connector and isolate the mass of the card assembly to prevent shock and vibration concerns within the connectors. Although not shown, the operations can be repeated if more loads are added by multiplexing through the use of the shoulder screws, and isolated with NIFs given that more shoulders are added to the shoulder screws.

It should be understood that the invention is not necessarily limited to the specific process, arrangement, materials and components shown and described above, but may be susceptible to numerous variations within the scope of the invention. For example, although the above-described exemplary aspects of the invention are believed to be particularly well suited for mounting a heat sink in contact with an electronic component such as a GPU, it is contemplated that the concepts disclosed herein can be used in other applications as well. The electronic components can comprise any of a central processing unit (CPU), a graphics processing unit (GPU), an application processor or other logic device, a memory chip, a global positioning system (GPS) chip, a radio frequency (RF) transceiver chip, a Wi-Fi chip, a system-on-chip, or any semiconductor chip that is suitable for an assembly requiring a multiplicity of loading and mass isolation.

Further, while the foregoing description refers to mezzanine cards (or mezzanine-style cards), it should be understood that the present disclosure may be applied to other types of PCB assemblies, such as memory cards, network cards, and other types of expansion cards.

It will be apparent to one skilled in the art that the manner of making and using the claimed invention has been adequately disclosed in the above-written description of the preferred embodiments taken together with the drawings. The above description of the preferred embodiments of the present invention are susceptible to various modifications, changes and adaptations, and the same are intended to be comprehended within the meaning and range of equivalents of the appended claims.

Those skilled in the art can make numerous uses and modifications of and departures from the apparatus and techniques disclosed herein without departing from the described concepts. For example, components or features illustrated or described in the present disclosure are not limited to the illustrated or described locations, settings, or contexts. Examples of apparatuses in accordance with the present disclosure can include all, fewer, or different components than those described with reference to one or more of the preceding figures. The present disclosure is therefore not to be limited to specific implementations described herein, but rather is to be accorded the broadest scope possible consistent with the appended claims, and equivalents thereof.

The invention claimed is:

1. An assembly comprising:
   a printed circuit board having an electronic component positioned thereon;
   a load frame mounted onto the electronic component, the load frame having an open region onto which the electronic component extends;
   a thermal interface material (TIM) disposed on the electronic component;
   a heat sink in thermal contact with the electronic component through the TIM;
   a first fastener configured to fasten the heat sink to the load frame and the printed circuit board, wherein fastening the first fastener creates a TIM bond line between the heat sink and the electronic component; and
   a second fastener disposed within a bore of the heat sink and threaded into the load frame to fasten the heat sink to the load frame after the first fastener has been fastened, wherein the second fastener comprises a threaded fastener with a head, a first ring disposed on the threaded fastener below the head of the threaded fastener, and a second ring disposed below the first ring, wherein at least one of the first and second rings are configured to expand radially to lock the heat sink into the load frame in a direction generally parallel to the TIM bond line, wherein the first fastener is removable to replace the component while the second fastener remains fastened.

2. The assembly of claim 1, wherein the first fastener comprises a screw fastener which comprises a head, a shoulder portion, and a threaded portion.

3. The assembly of claim 2, wherein the shoulder portion of the first fastener is positioned on the load frame.

4. The assembly of claim 2, wherein the first fastener further comprises compression springs positioned between the head and the shoulder portion.

5. The assembly of claim 4, wherein the first fastener further comprises wave springs located below the shoulder portion.

6. The assembly of claim 5, wherein:
the compression springs are positioned between the head of the first fastener and the heat sink for the compression springs to be seated on the heat sink; and
the wave springs are positioned below a stiffener support of the printed circuit board.

7. An assembly comprising:
a field-replaceable unit (FRU) comprising an electronic component;
a printed circuit board having the FRU positioned thereon;
a load frame mounted onto the printed circuit board, the load frame having an open region onto which the FRU extends, exposing a surface of the FRU;
a thermal interface material (TIM) disposed on the FRU;
a heat sink in thermal contact with the FRU through the TIM;
a first fastener configured to fasten the heat sink to the load frame and the printed circuit board; and
a second fastener disposed within a bore of the heat sink and threaded into the load frame, the second fastener configured to fasten the heat sink to the load frame after the first fastener has been fastened, wherein the second fastener comprises a threaded fastener with a head, a first ring disposed on the threaded fastener below the head of the threaded fastener, and a second ring disposed below the first ring, wherein at least one of the first and second rings are configured to expand radially to lock the heat sink into the load frame in a direction generally parallel to a length of the printed circuit board, wherein the first fastener is removable to replace the FRU while the second fastener remains fastened.

8. The assembly of claim 7, wherein the first fastener comprises a screw fastener which comprises a head, a shoulder portion, and a threaded portion.

9. The assembly of claim 8, wherein the shoulder portion of the first fastener is positioned on the load frame.

10. The assembly of claim 8, wherein the first screw fastener includes compression springs located between the head and the shoulder portion.

11. The assembly of claim 10, wherein the compression springs include conical springs.

12. The assembly of claim 7, wherein the first fastener is seated on the load frame prior to being actuated.

13. The assembly of claim 7, wherein the second fastener is configured to expand upon being tightened.

14. The assembly of claim 7, wherein the first fastener radially locks the heat sink into the load frame.

15. The assembly of claim 1, wherein the compression springs include conical springs.

16. The assembly of claim 1, wherein the first fastener is seated on the load frame prior to being actuated.

17. The assembly of claim 4, wherein the compression springs are positioned between the head of the first screw fastener and the heat sink for the compression springs to be seated on the heat sink.

* * * * *